(12) United States Patent
Summer

(10) Patent No.: US 10,033,347 B2
(45) Date of Patent: Jul. 24, 2018

(54) DC/DC ELECTRICAL CONFIGURATION FOR OPERATING OVER A LARGE SPAN OF INPUT VOLTAGES

(71) Applicant: Steven E. Summer, Plandome, NY (US)

(72) Inventor: Steven E. Summer, Plandome, NY (US)

( * ) Notice: Subject to any disclaimer, the term of this patent is extended or adjusted under 35 U.S.C. 154(b) by 0 days.

(21) Appl. No.: 15/160,946

(22) Filed: May 20, 2016

(65) Prior Publication Data

US 2016/0344284 A1 Nov. 24, 2016

Related U.S. Application Data

(60) Provisional application No. 62/164,928, filed on May 21, 2015.

(51) Int. Cl.
| | |
|---|---|
| *H03H 7/01* | (2006.01) |
| *H02M 1/32* | (2007.01) |
| *H02M 1/36* | (2007.01) |
| *H02M 3/155* | (2006.01) |
| *H02M 3/335* | (2006.01) |
| *H02M 1/00* | (2006.01) |

(52) U.S. Cl.
CPC .......... *H03H 7/0107* (2013.01); *H02M 1/32* (2013.01); *H02M 1/36* (2013.01); *H02M 3/155* (2013.01); *H02M 3/335* (2013.01); *H02M 2001/007* (2013.01); *H02M 2001/0022* (2013.01); *H02M 2001/0045* (2013.01)

(58) Field of Classification Search
CPC . H02M 2001/0022; H02M 2001/0016; H02M 2001/0067; H02M 2001/007; H03H 7/251–7/258; H03H 7/06–7/07; H03H 1/00–9/56; H03H 19/00–2210/04; H03H 2240/00–2260/00
USPC .............................. 363/39; 327/554
See application file for complete search history.

(56) References Cited

U.S. PATENT DOCUMENTS

| | | | | |
|---|---|---|---|---|
| 3,972,020 | A * | 7/1976 | Carroll ...................... | G01V 1/22 178/63 E |
| 4,038,990 | A * | 8/1977 | Thompson ............... | A61N 1/08 333/12 |
| 5,381,018 | A * | 1/1995 | Mojaradi ............. | H03K 17/102 250/551 |
| 6,407,633 | B1 * | 6/2002 | Dao ........................ | H03F 1/083 327/554 |
| 2001/0011880 | A1 * | 8/2001 | James ..................... | H02J 7/022 320/104 |
| 2007/0096849 | A1 * | 5/2007 | Inoue .................... | H01L 23/552 333/181 |
| 2007/0297202 | A1 * | 12/2007 | Zargari ................... | H02M 1/08 363/50 |
| 2014/0198417 | A1 * | 7/2014 | Wang ..................... | H02H 9/045 361/56 |

(Continued)

*Primary Examiner* — Gary L Laxton
*Assistant Examiner* — Peter Novak
(74) *Attorney, Agent, or Firm* — Steven M. Crosby; Feldman Law Group, P.C.

(57) ABSTRACT

A DC/DC electrical configuration for operating over a large span of input voltages. The electrical configuration converter including a pre-filter, a voltage limiter; a first DC/DC converter; a second DC/DC converter; a step-down transformer; and a rectifier filter. The DC-DC electrical configuration safely operates in a presence of an input voltage that varies in magnitude.

15 Claims, 4 Drawing Sheets

(56) References Cited

U.S. PATENT DOCUMENTS

2017/0125398 A1\* 5/2017 Nomura ............. H01L 27/0248

\* cited by examiner

14

DC/DC ELECTRICAL CONFIGURATION FOR OPERATING OVER A LARGE SPAN OF INPUT VOLTAGES

CROSS REFERENCE TO RELATED APPLICATIONS

This application is based on U.S. Provisional Pat. App. Ser. No. 62/164,928, filed on May 21, 2015. The provisional patent application identified above is incorporated here by reference in its entirety to provide continuity of disclosure.

BACKGROUND

Surge arresters are used to protect electrical equipment, such as transformers and circuit breakers, in substations and in rail systems against the effects of overvoltages caused by incoming surges. Such overvoltages can be caused by a direct or nearby lightning strike, an electromagnetic pulse, electrostatic discharge, or switching operations in the power supply system as well as in devices. Some overvoltages are very high in energy. The current from the surge is diverted through the arrester, in most cases to earth. Effective overvoltage protection requires that different surge arrester types be used according to the particular application.

A voltage sag is a short duration reduction in voltage which can be caused by a short circuit, overload or starting of electric motors. Voltage sag happens when the voltage decreases between 10 and 90 percent of nominal voltage for one-half cycle to one minute. A longer duration of low voltage would be called "sustained sag". The term voltage sag should not be confused with brownout which is the reduction of voltage for minutes or hours.

SUMMARY

The object of this invention is to implement a DC-DC converter configuration that is able to operate over a large span of input voltages, such as those encountered in railroad and shipboard applications. In addition, such applications must safely operate in the presence of voltage sag, peak voltages and surge voltages that are several times higher or lower in magnitude than the normal operating range. For example, the clearing of circuit breakers and protective devices often generates peak and surge voltages. The resultant peak or surge voltages often have a low source impedance and extremely fast rise time.

In one implementation, a DC/DC electrical configuration for operating over a large span of input voltages, the electrical configuration converter comprises: a pre-filter, a voltage limiter, a first DC/DC converter, a second DC/DC converter, a step-down transformer, and a rectifier filter, wherein the DC-DC electrical configuration safely operates in a presence of an input voltage that varies in magnitude.

In some implementations, the input voltage can have a normal operating range of ~725 VCD. In some implementations, a magnitude of the input voltage can vary between ~125 VCD to ~1200 VCD. In some implementations, a fast rise time of the input voltage can vary up to ~4000 VCD.

In some implementations, the pre-filter can be a cascade of at least two low pass filters. In some implementations, the voltage limiter can include a resistor connected to a gate of an FET, wherein the resistor equalizes the voltage drop across the FET when the FET operates in a linear mode.

In some implementations, the voltage limiter can include a series element and a shunt element. In some implementations, the series element can include a resistor string consisting of equal value resistors connected to gates of at least two FETs, wherein the resistor string equalizes the voltage drop across each of the at least two FETs when the at least two FETs operate in a linear mode.

In some implementations, when the input voltage is less than a desired voltage, the series element is conducting and in saturation and the shunt element is not conducting. In some implementations, when the input voltage is more than a desired voltage, the series element operates in a linear region, dropping a voltage difference between the input voltage and the desired output voltage and the shunt element is conducting.

In some implementations, the first DC/DC converter can be a DC/DC boost converter. In some implementations, input voltages between ~125 VDC and ~500 VDC can be boosted to 500 VDC by the DC/DC boost converter. In some implementations, the second DC/DC converter can provide step down and isolation of the input voltage and produce a clean DC voltage.

DETAILED DESCRIPTION

The clearing of circuit breakers and protective devices in railroad and shipboard applications often generates peak and surge voltages that are several times higher in magnitude than the normal operating range. These resultant peak or surge voltages often have a low source impedance and extremely fast rise time. The DC-DC converter of the disclosed technology can operate over these large spans of input voltages.

Figure 1:
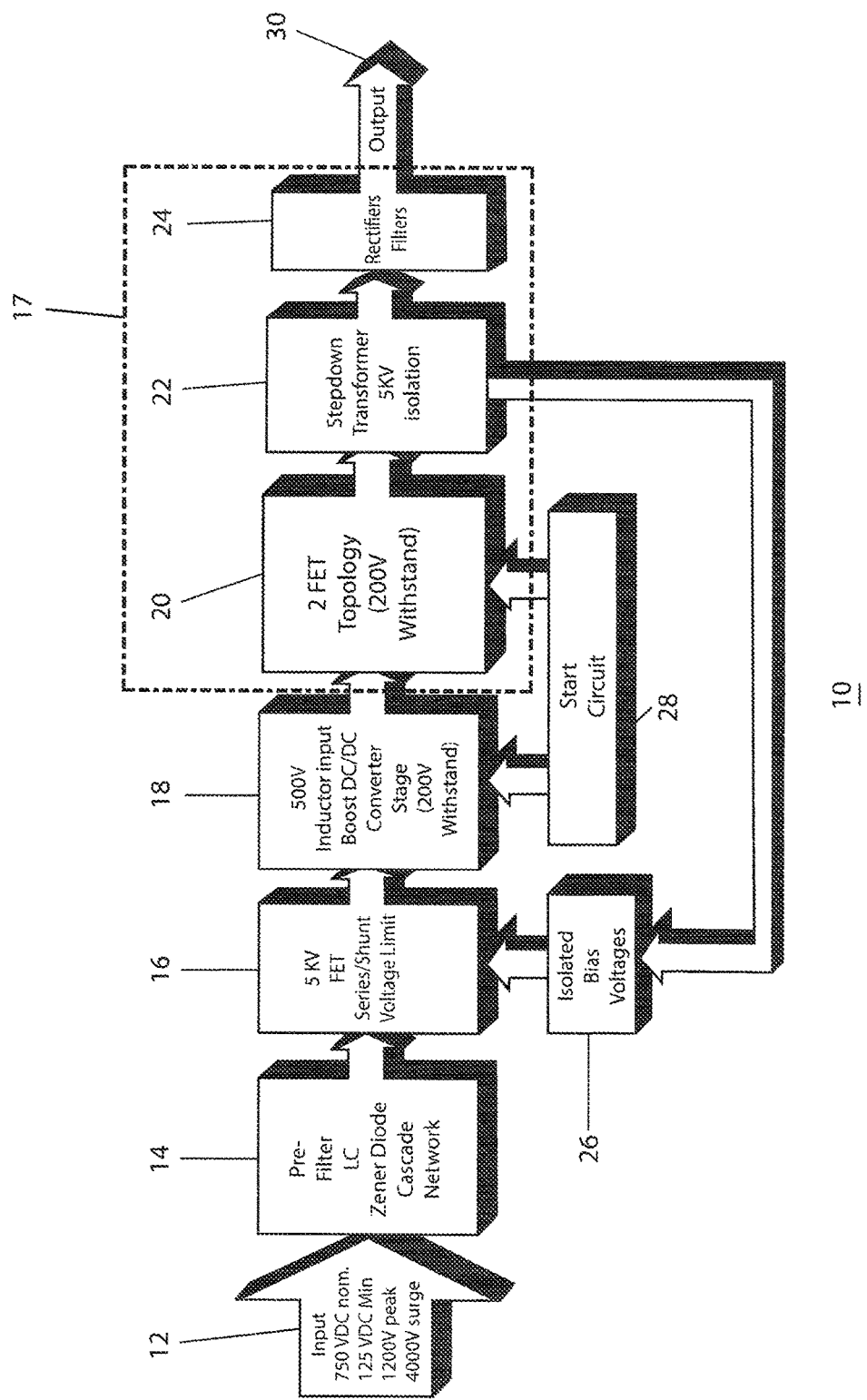
FIG. 1 is a block diagram of a DC/DC converter configuration of the disclosed technology.

As shown in FIG. 1, a high input voltage DC/DC converter 10 can have an input voltage 12. The input voltage can have a nominal input voltage of ~725 VDC but due to system fluctuations, discussed above, the operating range for the input voltage can vary from ~125 VDC to ~1200 VDC. In addition to these fluctuations, the DC-DC converter 10 is designed to withstand low source impedance and fast rise time surge up to ~4000 VDC.

The DC/DC converted is designed with a pre-filter 14 for the incoming input voltage 12. The function of pre-filter 14 is to slow down the rise time of fast rising surge voltages, as well as, to attenuate any conducted emissions generated by the DC-DC converter configuration 10.

Figure 2:
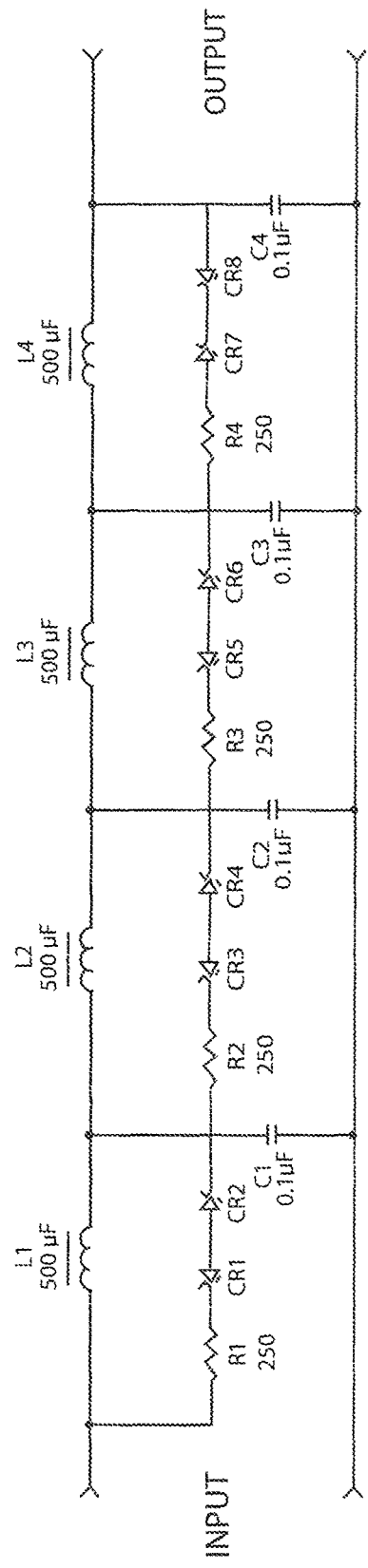
FIG. 2 is a circuit diagram of a pre-filter of the disclosed technology.

FIG. 2 shows an implementation of the pre-filter 14. The pre-filter 14 can have a cascade of four identical stages, although the number of stages required can be smaller or larger based on a desired input to output time delay and additional attenuation of conducted emissions. As shown in FIG. 2, the first stage consists of a low pass filter which is a LC circuit having a series inductor (L1) and shunt capacitor (C1). A resistor RI in series with two back-to-back Zener diodes placed across inductor L1. The purpose of the resistor and back-to-back Zener diodes is to damp the resonance of the LC circuit. The damped LC filters are cascaded. Each stage adds additional input to output time delay, as well as additional attenuation of conducted emissions.

The output of the pre-filter 14 is connected to a 5 KV rated series/shunt voltage limiter 16. The purpose of the voltage limiter 16 is to pass all input voltages (with as low as possible voltage drop) up to 1250 VDC. For input voltages greater than 1250 VDC up to the 5 KV rating, the output voltage of this block will be limited to 1250 VDC. A detailed drawing of a representative 5 KV series/shunt voltage limiter 16 is shown in FIG. 3.

The voltage limiter 16 has two main components—series element and shunt element. The input voltage 12 is applied to a series element consisting of a number, N, of FETs. When the applied voltage is less than the limit voltage or desired maximum output voltage, the series element is conducting and in saturation and the shunt element is not conducting. When the input voltage is more than the limit voltage, the series element operates in the linear region, dropping the voltage difference between the applied voltage and the desired maximum output voltage; the shunt element is conducting.

The requirement to operate at a high voltage, such as 5 KV, exceeds the voltage capability of virtually all commercially available FETs at this time. Therefore, it is necessary to use multiple FETs, connected in series, for implementing the series element. It is also desirable that a) when the string of series connected FETs operates in saturation that the total voltage drop across the FETs is minimized, and b) when the string of series connected FETs operates in the linear region, that the voltage drops across each device are approximately equal.

Figure 3:
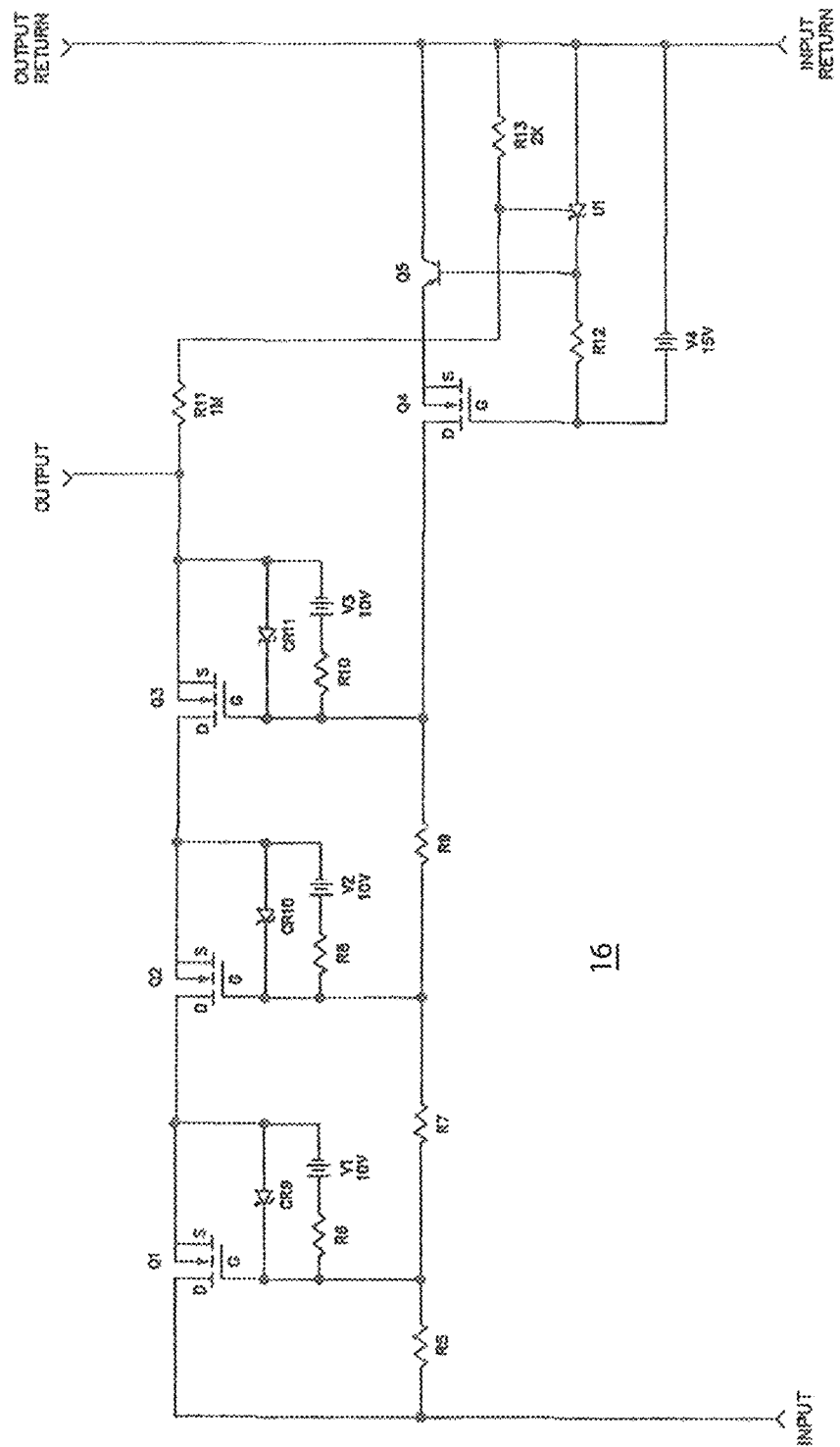
FIG. 3 is a circuit diagram of a voltage limiter of the disclosed technology.

FIG. 3 shows three FETs (Q1, Q2 and Q3) connected in series, although the number of FETs may be more or less as needed. A resistor string consisting of equal value resistors R5, R7 and R9 is connected to the gate of Q1, Q2 and Q3 respectively. The purpose of this resistor string is to equalize the voltage drop across each of the three FETs when the FET string operates in the linear mode.

The shunt element uses FET Q4 and PNP bipolar transistor Q5. Output voltage of the series/shunt voltage limiter feeds a voltage divider consisting of R11 and R13. The output of the divider feeds the adjust terminal of an adjustable shunt voltage regulator IC U1. The voltage from the resistor divider is compared to U1's internal 2.49 VDC voltage reference. The cathode current of U1 varies so as to make the voltage at the adjust pin of U1 equal the internal 2.49 VDC reference. In turn, this adjusts the voltage drop across resistor R12. The voltage at the cathode of adjustable shunt regulator U1 is buffered by emitter follower Q5, which drives the source terminal of FET Q4.

Voltage source V4 supplies a fixed gate voltage to FET Q4. When the output voltage of the series/shunt voltage limiter is less than the set point commanded by U1, the conduction of FET Q4 is cut off, and the bottom of the resistor string R5, R7 and R9 floats.

However each FET Q1, Q2 and Q3 is connected to isolated voltage source V1, V2 and V3 through resistors R6, R8 and R10 respectively. Each of these voltage sources V1, V2 and V3 are connected to the source terminals of FETs Q1, Q2 and Q3.

In addition, a low leakage Zener diode CR9, CR10 and CR11 is connected across each FET Q1, Q2 and Q3 to prevent the gate to source voltage from exceeding safe limits.

Although voltage sources V1, V2, V3 and V4 are represented as batteries, they may also be generated from isolated transformer windings that are rectified and filtered producing isolated bias voltages 26.

The series/shunt voltage limiter 16 is followed by an inductor input boost DC/DC converter 18 and a non-isolated buck DC-DC converter circuit 17, as shown, in FIG. 1. In simplified form, the boost DC/DC converter 18 consists of a boost inductor L5, a switching FET Q6, a catch, diode CR12, an output capacitor C5 and a control circuit that supplies pulse width modulated pulses to Q6.

In this representative application, the input voltage can be as low as ~125 VDC or as high as ~1250 VDC. In many applications requiring operation over a wide voltage range, a relatively limited normal steady state voltage range exists, and voltage sags or brownouts as well as voltage surges, are limited in time duration. In such a situation, it is advantageous to boost the input voltage to a level that is close to the normal steady state operation range.

The boosted voltage is then more limited in range, and can more efficiently feed a downstream isolated DC-DC converter. Please note, many dc-dc converters require relatively large amounts of input current at startup (when input power is first applied). A soft-start circuit 28 minimizes this large input current by gradually increasing the switch-current limit at startup, slowing the rate of rise of the output voltage and reducing the peak current required when starting up.

In the depicted application, the inductor input DC-DC boost converter 18 has a set point of ~500 VDC. Input voltages between the levels of 125 VDC and 500 VDC are boosted to ~500 VDC. At input voltages greater than 500 VDC, no boost is commanded by the control circuitry.

Therefore, the FET Q6 does not switch on, but remains off. Input voltage passes directly through inductor L5 and diode CR12. The voltage drop across these two components is relatively small, so the overall efficiency is not negatively affected above 500 VDC.

Figure 4:
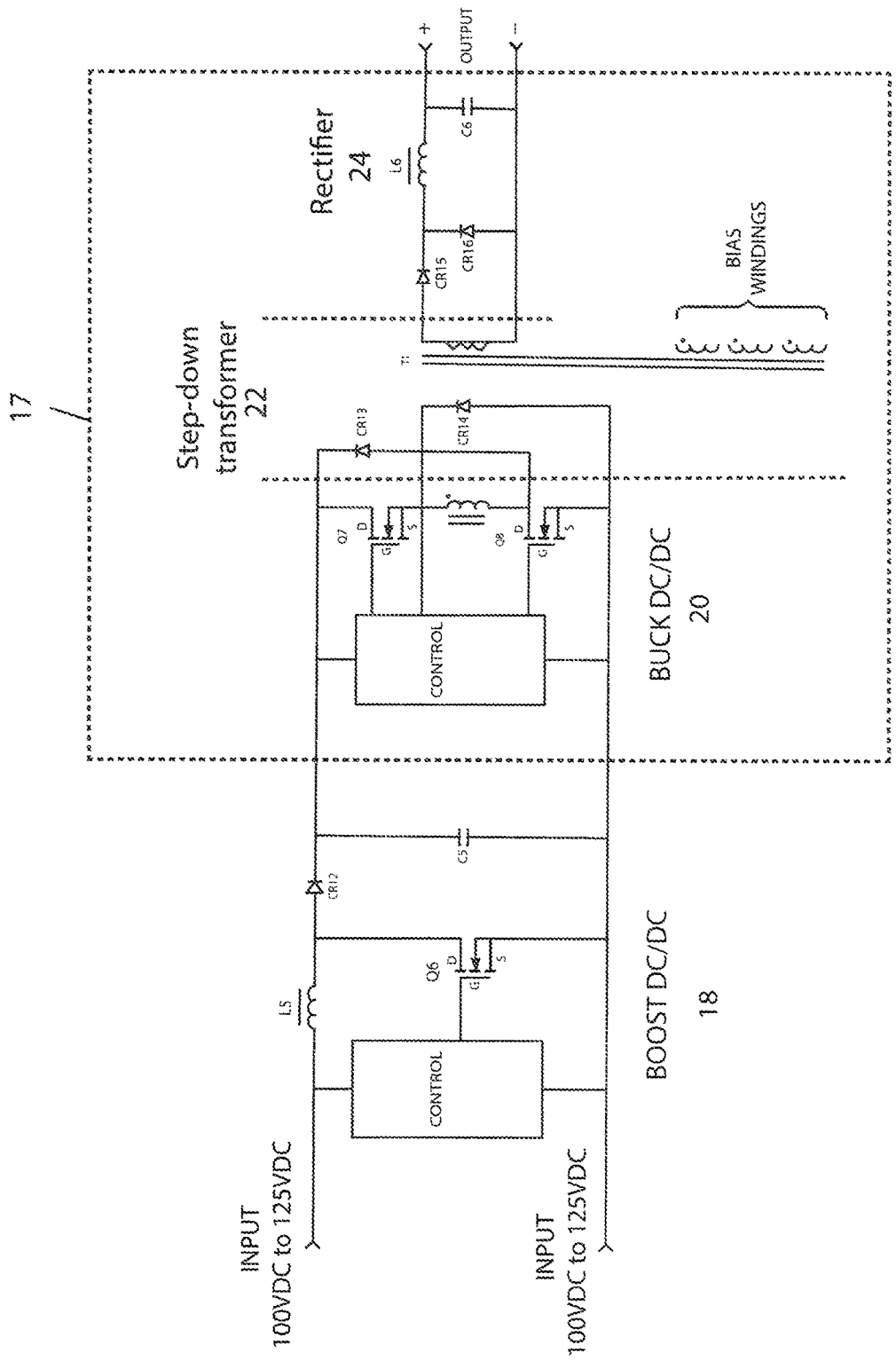
FIG. 4 is a circuit diagram of two DC/DC converters, a step-down transformer and rectifier filter of the disclosed technology.

The second DC-DC converter 17 shown in FIG. 4 provides step down and isolation. A two FET forward converter topology 2Q is best suited for this application since the voltage stress on the two FETs is essentially limited to the rail voltage. A PWM control circuit drives two N FETs Q7 and Q8. The two FET forward converter topology 20 is followed by stepdown transformer 5 KV isolation 22. As shown in FIG. 4, on the turn off of the FETs, catch diodes CR13 and CR14 provide a path for transformer T1's connection to the rail voltage across C5.

On the secondary side of T1, the main power output is rectified by rectifier filters 24. The main power output is rectified by diode CR15. Diode CR16 provides a path for L6's current on the off portion of the cycle. L6 and C6 smooth the PWM output, producing a clean DC voltage 30.

Multiple bias windings on T1, when rectified and filtered, provide isolated bias power 26 for the four voltage sources shown in the series/shunt voltage limiter 16.

The foregoing Detailed Description is to be understood as being in every respect illustrative and exemplary, but not restrictive, and the scope of the disclosed technology disclosed herein is not to be determined from the Detailed Description, but rather from the claims as interpreted according to the full breadth permitted by the patent laws. It is to be understood that the embodiments shown and described herein are only illustrative of the principles of the disclosed technology and that various modifications may be implemented by those skilled in the art without departing from the scope and spirit of the disclosed technology. Those skilled in the art could implement various other feature combinations without departing from the scope and spirit of the disclosed technology. Although the embodiments of the present disclosure have been described with specific examples, it is to be understood that the disclosure is not limited to those specific examples and that various other changes, combinations and modifications will be apparent to one of ordinary skill in the art without departing from the scope and spirit of the disclosed technology which is to be determined with reference to the following claims.

The invention claimed is:

1. An DC/DC electrical configuration for operating over a large span of input voltages, the electrical configuration converter comprising:
   a pre-filter, the pre-filter including a cascade of at least two stages allowing for an input to output time delay, the at least two stages including an LC circuit and a resistor in series with two back-to-back Zener diodes, wherein the resistor in series with the two back-to-back Zener diodes are placed across an inductor of the LC circuit with one of the Zener diodes being directly connected to the inductor;
   a voltage limiter;
   a first DC/DC converter;
   a second DC/DC converter,
   a step-down transformer; and
   a rectifier filter,
   wherein the DC-DC electrical configuration safely operates in a presence of an input voltage that varies in magnitude.

2. The DC/DC electrical configuration of claim 1 wherein the input voltage has a normal operating range of ~725 VDC.

3. The DC/DC electrical configuration of claim 1 wherein a magnitude of the input voltage varies between ~125 VDC to ~1200 VDC.

4. The DC/DC electrical configuration of claim 1 wherein a fast rise time of the input voltage varies up to ~4000 VDC.

5. The DC/DC electrical configuration of claim 1 wherein the at least two identical stages are at least two low pass filters.

6. The DC/DC electrical configuration of claim 1 wherein the voltage limiter includes a resistor connected to a gate of an FET, wherein the resistor equalizes the voltage drop across the FET when the FET operates in a linear mode.

7. The DC/DC electrical configuration of claim 1 wherein the voltage limiter includes a series element and a shunt element.

8. The DC/DC electrical configuration of claim 7 wherein the series element includes a resistor string consisting of equal value resistors connected to gates of at least two FETs, wherein the resistor string equalizes the voltage drop across each of the at least two FETs when the at least two FETs operate in a linear mode.

9. The DC/DC electrical configuration of claim 7 wherein, when the input voltage is less than a desired voltage, the series element is conducting and in saturation and the shunt element is not conducting.

10. The DC/DC electrical configuration of claim 7 wherein, when the input voltage is more than a desired voltage, the series element operates in a linear region, dropping a voltage difference between the input voltage and the desired output voltage and the shunt element is conducting.

11. The DC/DC electrical configuration of claim 1 wherein the first DC/DC converter is a DC/DC boost converter.

12. The DC/DC electrical configuration of claim 11 wherein input voltages between ~125 VDC and ~500 VDC are boosted to ~500 VDC by the DC/DC boost converter.

13. The DC/DC electrical configuration of claim 1 wherein the second DC/DC converter provides step down and isolation of the input voltage and produces a clean DC voltage.

14. An DC/DC electrical configuration for operating over a large span of input voltages, the electrical configuration converter comprising:
   a pre-filter, the pre-filter including a cascade of at least two stages allowing for an input to output time delay, the at least two stages including an LC circuit and a resistor in series with two back-to-back Zener diodes, wherein a terminal of one of the two back-to-back Zener diodes is directly connected to a terminal of an inductor of the LC circuit;
   a voltage limiter;
   a first DC/DC converter;
   a second DC/DC converter;
   a step-down transformer; and
   a rectifier filter,
   wherein the DC-DC electrical configuration safely operates in a presence of an input voltage that varies in magnitude.

15. An DC/DC electrical configuration for operating over a large span of input voltages, the electrical configuration converter comprising:
   a pre-filter, the pre-filter including a cascade of at least two stages allowing for an input to output time delay, the at least two stages including an LC circuit and a resistor in series with two back-to-back Zener diodes, wherein the resistor in series with the two back-to-back Zener diodes are placed in parallel to an inductor of the LC circuit;
   a voltage limiter;
   a first DC/DC converter;
   a second DC/DC converter;
   a step-down transformer; and
   a rectifier filter,
   wherein the DC-DC electrical configuration safely operates in a presence of an input voltage that varies in magnitude.

* * * * *